US008848092B2

(12) United States Patent
Yukawa

(10) Patent No.: US 8,848,092 B2
(45) Date of Patent: Sep. 30, 2014

(54) SOLID-STATE IMAGING DEVICE AND ELECTRONIC APPARATUS

(75) Inventor: Hiroaki Yukawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/528,177

(22) Filed: Jun. 20, 2012

(65) Prior Publication Data

US 2012/0256285 A1    Oct. 11, 2012

Related U.S. Application Data

(62) Division of application No. 12/755,794, filed on Apr. 7, 2010, now abandoned.

(30) Foreign Application Priority Data

Apr. 15, 2009   (JP) ................................. 2009-098612

(51) Int. Cl.
| | | |
|---|---|---|
| H04N 5/335 | (2011.01) | |
| H04N 5/225 | (2006.01) | |
| H01L 31/0232 | (2014.01) | |
| H01J 40/14 | (2006.01) | |
| G02B 9/00 | (2006.01) | |
| H01L 31/0216 | (2014.01) | |
| H01L 27/146 | (2006.01) | |

(52) U.S. Cl.
CPC .... *H01L 27/14621* (2013.01); *H01L 31/02165* (2013.01)
USPC ........... 348/340; 348/308; 257/436; 250/226; 359/652

(58) Field of Classification Search
CPC ................... H01L 31/02327; H01L 31/02162; H01L 27/14621; H01L 27/14685; G01J 1/0488; G01J 1/0437; G01J 1/0492; G01J 3/51; G02B 1/04; G02B 21/0064
USPC .................. 348/308, 335, 340; 257/432, 436; 250/216, 226; 359/566, 652, 654
See application file for complete search history.

(56) References Cited

U.S. PATENT DOCUMENTS

| | | |
|---|---|---|
| 2006/0205107 A1 | 9/2006 | Inaba et al. |
| 2008/0272454 A1 | 11/2008 | Toshikiyo et al. |
| 2009/0020690 A1* | 1/2009 | Toda .......................... 250/227.2 |

FOREIGN PATENT DOCUMENTS

WO    2005/069376    6/2012

* cited by examiner

*Primary Examiner* — Sinh Tran
*Assistant Examiner* — Mark Monk
(74) *Attorney, Agent, or Firm* — Sheridan Ross P.C.

(57) ABSTRACT

A solid-state imaging device includes: a light-receiving element; and a multilayer film which is disposed on a side of a light-receiving surface of the light-receiving element and is formed by laminating a plurality of layers made of materials having different refractive indices, in which a defect layer is included in at least one of the laminated layers, wherein in the defect layer, a plurality of kinds of materials having different refractive indices coexist in a surface parallel to the light-receiving surface.

13 Claims, 10 Drawing Sheets

SOLID-STATE IMAGING DEVICE AND ELECTRONIC APPARATUS

RELATED APPLICATION DATA

This application is a division of U.S. patent application Ser. No. 12/755,794, filed on Apr. 7, 2010, the entirety of which is incorporated herein by reference to the extent permitted by law. The present invention claims priority to and contains subject matter related to Japanese Patent Application JP 2009-098612 filed in the Japan Patent Office on Apr. 15, 2009, the entire contents of which being incorporated herein by reference.

BACKGROUND OF THE INVENTION

1. Field of the Invention

The present invention relates to a solid-state imaging device that is used as an imaging device and an electronic apparatus having the solid-state imaging device mounted thereon.

2. Description of the Related Art

In solid-state imaging devices represented by CMOS (Complementary Metal Oxide Semiconductor) sensors, organic materials are generally used as the materials of color filters for achieving color separation. This is because organic materials provide a high degree of freedom for absorption spectral characteristic design and make it easy to obtain characteristics close to those desired.

However, the use of organic materials may result in a great increase in cost and even insufficient durability in view of temperature characteristics and light stability. Moreover, the processes that can be used for the upper layers of the organic material layer are limited. For example, it is very difficult to form microstructures that have a transmittance-improving effect on the upper layers of the color filter.

For these and other reasons, the use of an inorganic multilayer film in the color filters of a solid-state imaging device has been proposed (see the Pamphlet of WO2005/069376, for example).

SUMMARY OF THE INVENTION

To achieve color separation in a solid-state imaging device, it is necessary to obtain different optical characteristics for three colors (RGB) in each pixel. In the related-art technique described in WO2005/069376, when color separation is achieved using an inorganic multilayer film, the different optical characteristics for three colors are obtained by changing the height (thickness) of a layer (defect layer) having a different center thickness in the inorganic multilayer film.

However, in the configuration where the different optical characteristics for three colors are obtained by changing the thicknesses of the defect layers in the inorganic multilayer film, portions disposed on the upper layer side of the defect layers have such a shape that each pixel has a step. For this reason, there is concern that the amount of light transmitting through the inorganic multilayer film may decrease due to a bulge of the step portions.

It is therefore desirable to provide a solid-state imaging device and an electronic apparatus in which even when color separation is achieved using a multilayer film, the multilayer film does not have a stepped shape but has a uniform thickness for each pixel, thus providing good optical characteristics.

According to an embodiment of the present invention, there is provided a solid-state imaging device including: a light-receiving element; and a multilayer film which is disposed on a side of a light-receiving surface of the light-receiving element and is formed by laminating a plurality of layers made of materials having different refractive indices, in which a defect layer is included in at least one of the laminated layers, in which in the defect layer, a plurality of kinds of materials having different refractive indices coexist in a surface parallel to the light-receiving surface.

In the solid-state imaging device having the above-mentioned configuration, the refractive index in the defect layer depends on the ratio of areas of the materials coexisting in the surface. That is to say, by changing the area ratio (duty ratio) of the materials in the surface, a desired wavelength of light is allowed to pass through the multilayer film. Therefore, the multilayer film can be formed into a uniform thickness regardless of the wavelength of light to be transmitted.

In the embodiment of the present invention, even when a multilayer film in which a plurality of layers made of different materials are laminated is used as a color filter for achieving color separation, the multilayer film has a uniform thickness and will not have a stepped shape in each pixel. Therefore, it is possible to prevent the amount of transmitted light from decreasing due to a bulge of the step portions. That is to say, according to the embodiment of the present invention, it is possible to obtain good optical characteristics for the multilayer film used as a color filter.

DETAILED DESCRIPTION OF THE INVENTION

Hereinafter, modes for carrying out the present invention (hereinafter referred to as embodiments) will be described. The description will be given in the following order.
1. Exemplary Basic Configuration of Solid-State Imaging Device;
2. First Embodiment (Exemplary Configuration and Manufacturing Method);
3. Second Embodiment;
4. Third Embodiment; and
5. Exemplary Configuration of Electronic Apparatus

1. Exemplary Basic Configuration of Solid-State Imaging Device

Figure 1:
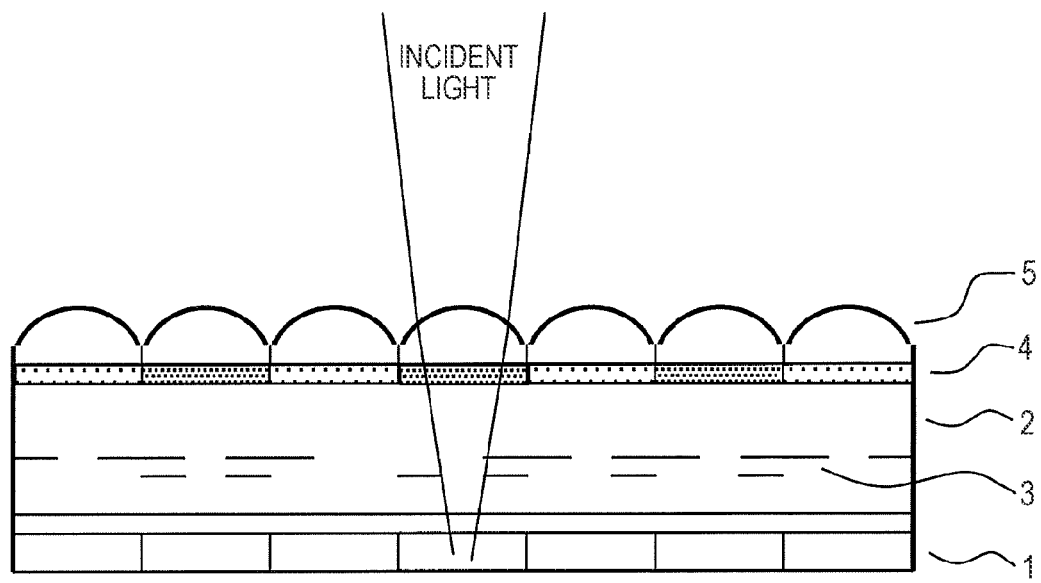
FIG. 1 is a sectional side view showing an exemplary basic configuration of a solid-state imaging device.

FIG. 1 is a sectional side view showing an exemplary basic configuration of a solid-state imaging device.

The solid-state imaging device shown in FIG. 1 is one that is widely known as a CMOS sensor, for example, and a plurality of light-receiving elements 1 are arranged in a surface of a semiconductor substrate that is not shown. Each of the light-receiving elements 1 corresponds to one pixel. Each light-receiving element 1 is covered with an interlayer insulating film 2 made of a light-transmitting material, and multilayer wirings 3 are arranged in the interlayer insulating film 2. Moreover, on the interlayer insulating film 2, namely on a side of a light-receiving surface of the light-receiving element 1, a planarization process is performed by CMP (Chemical Mechanical Polishing), for example, and an on-chip color filter (OCCF) 4 that transmits only a specific color component of light is disposed. On the OCCF 4, an on-chip microlens (OCL) 5 for focusing an incident light on each of the light-receiving elements 1 is disposed.

Figure 2:
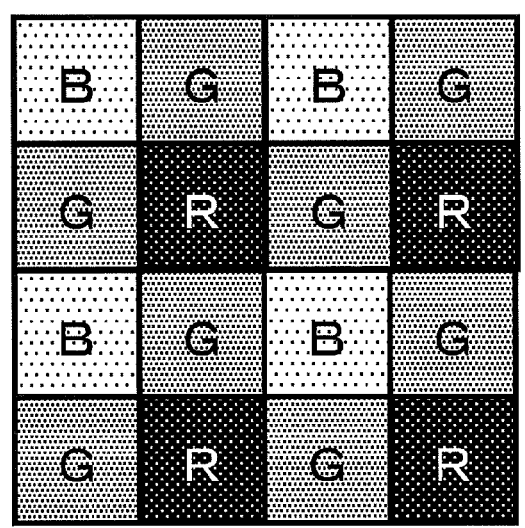
FIG. 2 is a plan view showing a specific example of a two-dimensional arrangement of an OCCF.

FIG. 2 is a plan view showing a specific example of a two-dimensional arrangement of an OCCF.

The OCCF 4 is configured to separate a different color component for each pixel. Specifically, as shown in FIG. 2, the OCCF 4 is arranged in a so-called Bayer arrangement in which a row of repeated R (red) and G (green) pixels and a subsequent row of repeated G and B (blue) pixels appear so as to correspond to respective pixels that are arranged two-dimensionally in a matrix form.

2. First Embodiment

Next, a main characteristic part of the solid-state imaging device according to an embodiment of the present invention will be described.

In this section, the OCCF 4 will be described in detail as the main characteristic part of the solid-state imaging device.

Exemplary Configuration

Figure 3:
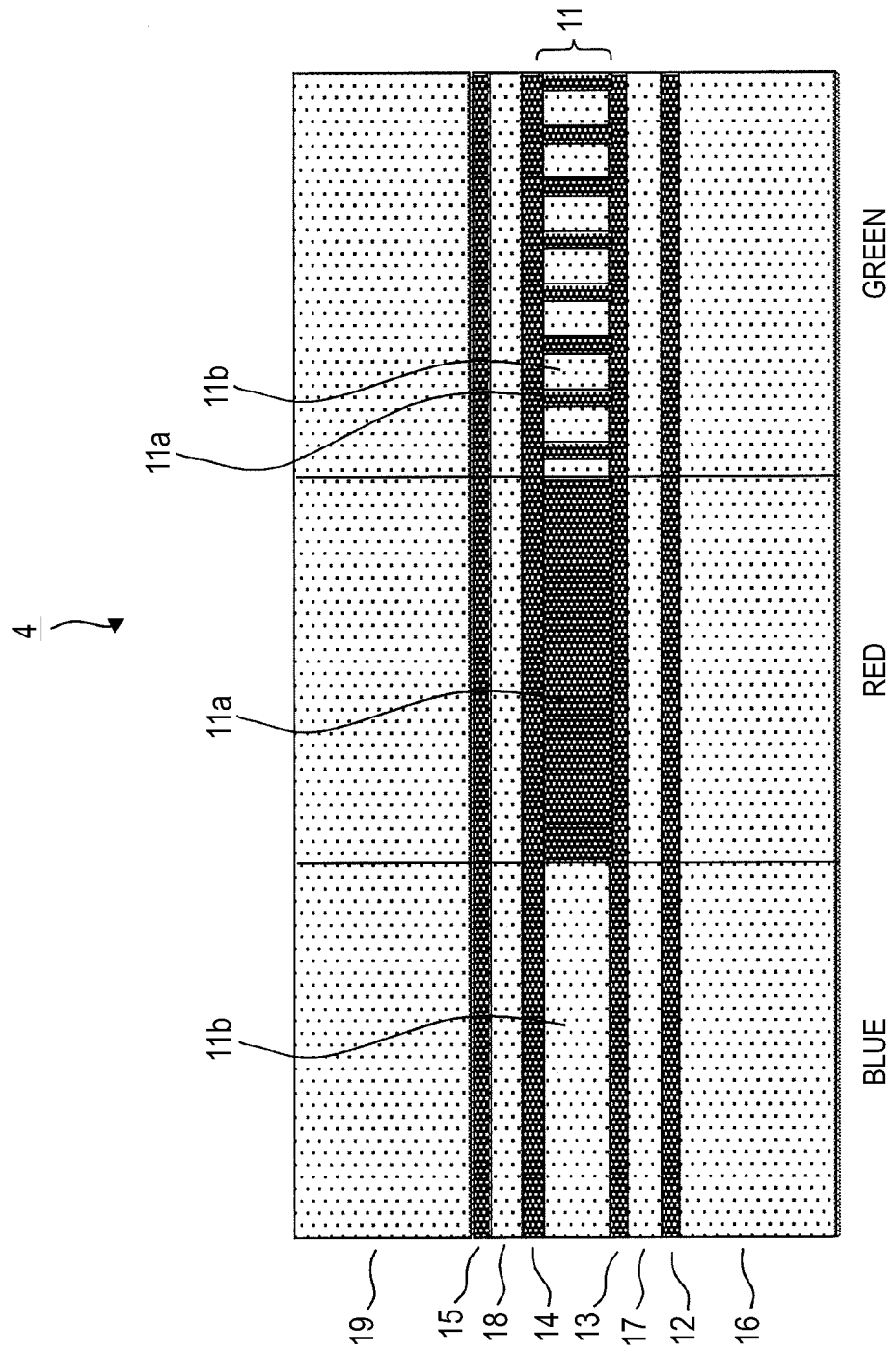
FIG. 3 is a sectional side view showing an exemplary specific configuration of the OCCF according to an embodiment of the present invention.

FIG. 3 is a sectional side view showing an exemplary specific configuration of the OCCF according to the embodiment of the present invention.

The OCCF 4 shown in FIG. 3 is formed of a multilayer film in which a plurality of layers made of materials having different refractive indices is laminated. As the materials having different refractive indices, inorganic materials can be used. This is because inorganic materials are advantageous over organic materials in view of cost, durability, degree of freedom in process choice, and the like. Specifically, examples of the plurality of inorganic materials having different refractive indices include silicon dioxide ($SiO_2$) having a low refractive index and titanium dioxide ($TiO_2$) having a high refractive index. A multilayer film in which layers of these materials are laminated is typically called a dielectric multilayer film, and in this specification, will be simply called "multilayer film". The lamination direction of the solid-state imaging device is the same as the lamination direction of the multilayer film.

Moreover, the multilayer film that constitutes the OCCF 4 includes at least one defect layer 11 having a different center thickness in the laminated layers.

Therefore, the multilayer film that constitutes the OCCF 4 has a laminated structure in which two layers of $TiO_2$ layers 12, 13, 14, and 15 and $SiO_2$ layers 16, 17, 18, and 19 are repeatedly laminated in a predetermined order above and below the defect layer 11. That is to say, because of the characteristics necessary for a solid-state imaging device, the laminated structure of the multilayer film includes 9 layers in total composed of a periodic structure of each four layers 12 to 19 disposed above and below the defect layer 11. In this case, the $TiO_2$ layers 12, 13, 14, and 15 and the $SiO_2$ layers 16, 17, 18, and 19 may be configured to have an optical thickness of $\lambda/4$. Here, the optical thickness is a value nd that is obtained by multiplying the refractive index n of the material of the layer by the thickness d of the layer. In addition, $\lambda$ is the wavelength of light that is transmitted through the OCCF 4.

The defect layer 11 has a configuration such that a plurality of kinds of materials having different refractive indices coexist in a surface parallel to the light-receiving surface of the light-receiving element 1. The plurality of kinds of materials having different refractive indices may be $SiO_2$ having a low refractive index and $TiO_2$ having a high refractive index. That is to say, the same formation materials as those used for the other layers 12 to 19 of the multilayer film other than the defect layer 11 may be used. Therefore, in the defect layer 11, $TiO_2$ portions 11a and $SiO_2$ portions 11b coexist. In this case, the $TiO_2$ portions 11a and the $SiO_2$ portions 11b are arranged so that they coexist in a regular pattern.

However, the arrangement pattern of the $TiO_2$ portions 11a and the $SiO_2$ portions 11b is symmetrical in two orthogonal directions in the surface. Here, the arrangement pattern that is symmetrical in two orthogonal directions implies that the same pattern is obtained even when the pattern is rotated by 90° in the surface.

Figure 4A:
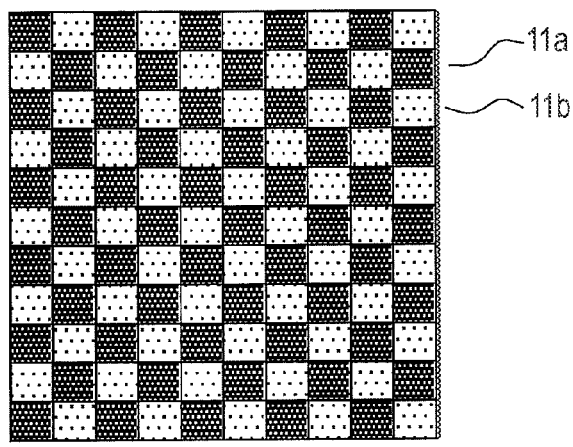
FIGS. 4A to 4C are diagrams showing a specific example of a pattern that is symmetrical in two orthogonal directions.
Figure 4B:
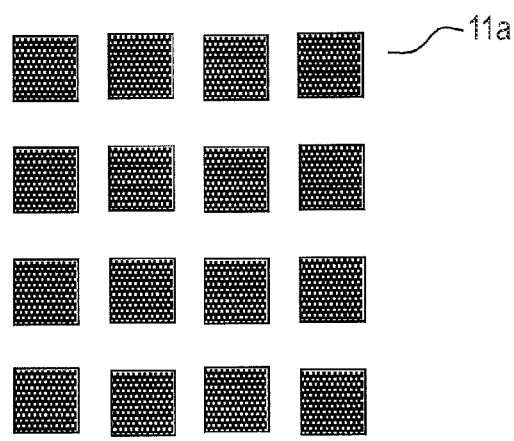
Figure 4C:
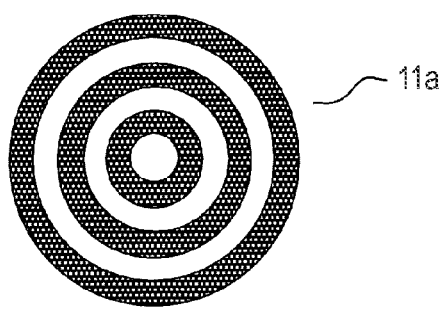

FIGS. 4A to 4C are diagrams showing a specific example of a pattern that is symmetrical in two orthogonal directions.

The pattern that is symmetrical in two directions may be a so-called checker pattern in which the $TiO_2$ portions 11a and the $SiO_2$ portions 11b are alternately arranged in a checkered pattern as shown in FIG. 4A. The example shown in FIG. 4A shows a checker pattern in which the ratio of areas of the portions 11a and 11b is 0.5.

The arrangement pattern of the $TiO_2$ portions 11a and the $SiO_2$ portions 11b is not particularly limited to the checker pattern. That is to say, as long as the same pattern is obtained even when the pattern is rotated by 90° in the surface, an equiangular rectangular pattern as shown in FIG. 4B or a concentric pattern as shown in FIG. 4C may be used, for example.

Moreover, in the arrangement pattern of the $TiO_2$ portions 11a and the $SiO_2$ portions 11b, the ratio of areas of the portions 11a and 11b is set based on the wavelength of light reaching the light-receiving element. Here, the "ratio of areas" mentioned above refers to the ratio of the area of the $TiO_2$ portions 11a to the area of the $SiO_2$ portions 11b coexisting in a predetermined region (for example, one pixel region) of the surface. Hereinafter, the ratio of areas will be simply referred to as "area ratio" or "duty ratio". That is to say, since the defect layer has a microstructure that uses $TiO_2$ and $SiO_2$ which are examples of a plurality of kinds of materials having different refractive indices, by changing the area ratio (duty ratio) of the respective materials in the surface, a desired wavelength of light is allowed to pass therethrough. Therefore, when the plurality of light-receiving elements 1 are arranged so as to correspond to different colors, respectively, the duty ratio of the $TiO_2$ portions 11a and the $SiO_2$ portions 11b will be different for each pixel.

In the microstructure that uses $TiO_2$ and $SiO_2$ which are examples of the plurality of kinds of materials having different refractive indices, it is known that the microstructure exhibits a refractive index given by Formula 4 below when the microstructure is sufficiently smaller than the wavelength of light. Here, the derivation process of Formula 4 will be described in brief.

Figure 5A:
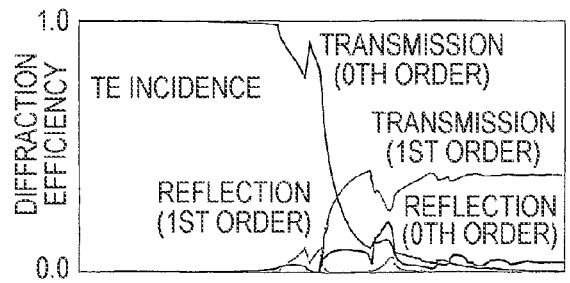
FIGS. 5A to 5C are diagrams showing an overview of diffraction optics in the sub-wavelength domain.
Figure 5B:
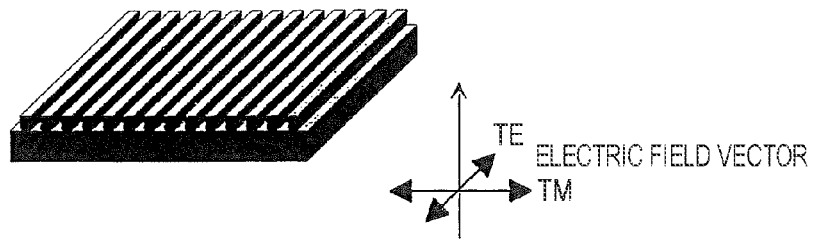
Figure 5C:
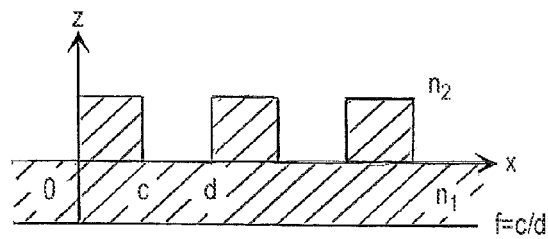

FIGS. 5A to 5C are diagrams showing an overview of diffraction optics in the sub-wavelength domain. When a beam having a certain wavelength is incident on a diffractive grating having a periodic structure, high-order light is output in addition to the 0th-order beam as shown in FIG. 5A. However, when the period of the periodic structure decreases to be the same or smaller than the wavelength of an incident beam, the diffraction condition for high-order light is no longer valid. Therefore, the output beam will be substantially composed of the 0th-order beam. The phase of the 0th-order beam depends on the parameters of the 0th-order grating, and the value of the phase can be changed within a certain range (Effective Media Theory). An example will be described by way of a structural birefringent portion formed of a plurality of concavo-convex portions, as shown in FIG. 5B. When the pitch of the concavo-convex portions of the structural birefringent portion is decreased to be smaller than the wavelength of transmitted light, a refractive index relative to a TM-polarized light and a refractive index relative to a TE-polarized light may have different values. Thus, the structural birefringent portion has properties equivalent to those of a birefringent material. Specifically, when the concavo-convex pitches c and d and the refractive indices n1 and n2 are defined as shown in FIG. 5C, the refractive index $n_{TE}$ relative to the TE-polarized light, the refractive index $n_{TM}$ relative to the TM-polarized light, and the relationship between these refractive indices can be expressed by Formulas 1, 2, and 3 below. These formulas are known in the related art.

$$\bar{n}_{TE} = \sqrt{fn_1^2 + (1-f)n_2^2} \qquad (1)$$

$$\bar{n}_{TM} = \cfrac{1}{\sqrt{f/n_1^2 + (1-f)/n_2^2}} \qquad (2)$$

$$\bar{n}_{TE} > \bar{n}_{TM} \qquad (3)$$

Figure 6:
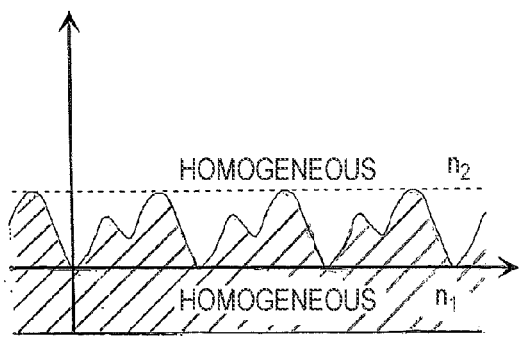
FIG. 6 is a diagram showing an overview of a resonance domain.

FIG. 6 is a diagram showing an overview of a resonance domain. In the resonance domain, it is necessary to regard light as electromagnetic waves. That is, light is regarded as vector waves. Specifically, in the resonance domain, propagation of light in a grating layer is calculated by solving the Maxwell equation. Moreover, as shown in FIG. 6, the boundary condition at the boundary of homogeneous media must be satisfied. For this reason, in the resonance domain, propagation of light greatly depends on polarization, and a very small change in optical constant may result in a great characteristic change. This is known in the related art.

Figure 7:
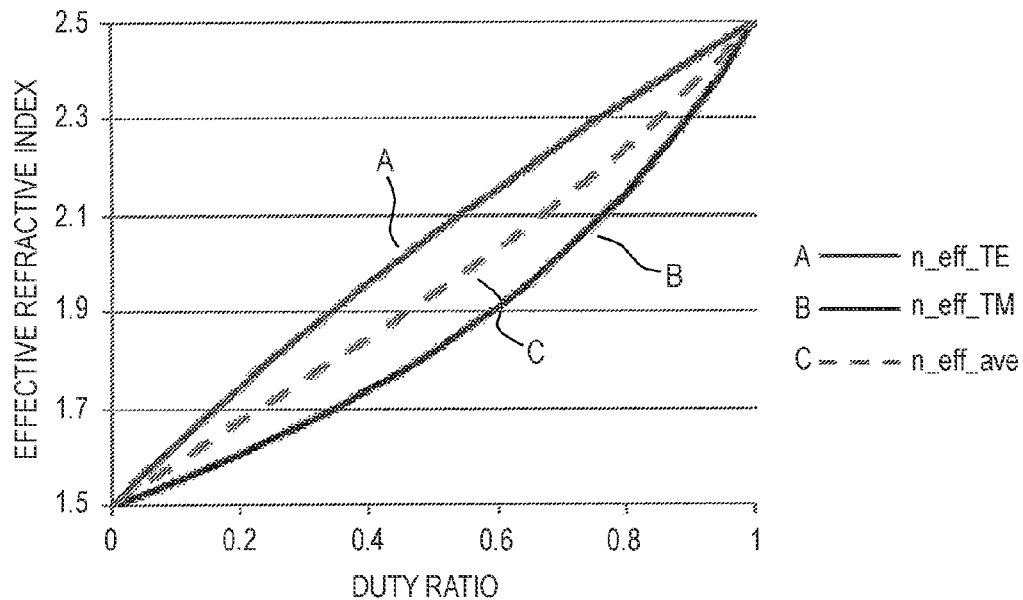
FIG. 7 is a graph showing an example of the results obtained by plotting the relationship between respective items described based on FIGS. 5A to 5C and FIG. 6.

FIG. 7 is a graph showing an example of the results obtained by plotting the relationship between respective items described based on FIGS. 5A to 5C and FIG. 6. In the drawing, the line A represents a refractive index when an electric field is parallel to a groove, and the line B represents a refractive index when the electric field is perpendicular to the groove.

When the $TiO_2$ portions 11a and the $SiO_2$ portions 11b are arranged in a checker pattern, the defect layer 11 has a refractive index (the line C) that is intermediate of those of the lines A and B. That is to say, it can be seen that in the case of the checker pattern, the duty ratio and the effective refractive index of the respective materials have an approximately proportional value.

Therefore, the refractive index for the checker pattern can be approximated by Formula 4 below if the high refractive index nh is 2.5, the low refractive index nl is 1.5, and the duty ratio is d.

$$n\_eff \approx nl \cdot d + nh \cdot (1-d) \qquad (4)$$

Figure 8:
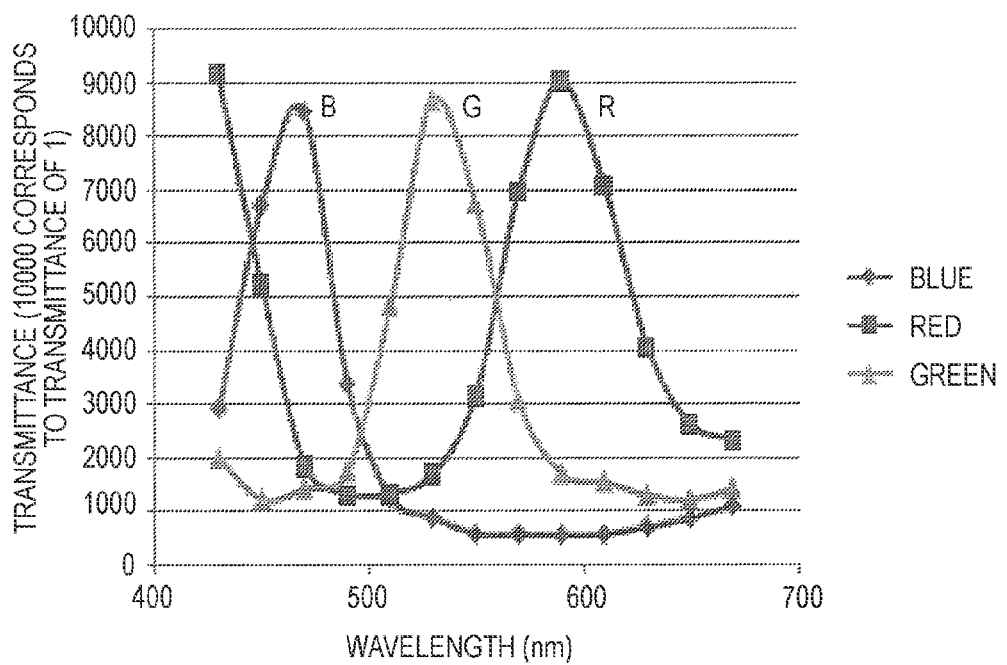
FIG. 8 is a graph showing a specific example of a change in transmission characteristics when the area ratio (duty ratio) of a checker pattern is changed.

FIG. 8 is a graph showing a specific example of a change in transmission characteristics when the area ratio (duty ratio) of a checker pattern is changed.

FIG. 8 shows the calculation results of a change in the transmission characteristics using a FDTD (finite-difference time-domain) method when the duty ratios are R:1.0, G:0.5, and B:0, respectively. In the graph, 10000 corresponds to transmittance of 1.

To obtain such a change in the transmission characteristics as shown in FIG. 8, because of the characteristics necessary for a solid-state imaging device, the OCCF 4 preferably has a configuration such that the laminated structure of the multi-layer film includes 9 layers in total (a periodic structure composed of each four layers disposed above and below the defect layer 11), and the thickness of the defect layer 11 is ½ of the wavelength λ of blue light.

Manufacturing Method

FIGS. 9A to 9F are sectional side views showing a specific example of a manufacturing method of the OCCF according to the embodiment of the present invention.

The OCCF can be manufactured by the following method.

Figure 9A:
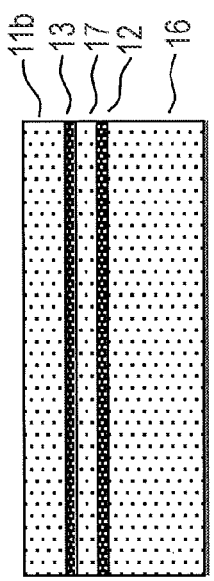
FIGS. 9A to 9F are sectional side views showing a specific example of a manufacturing method of the OCCF according to the embodiment of the present invention.

First, as shown in FIG. 9A, a $SiO_2$ layer 16, a $TiO_2$ layer 12, a $SiO_2$ layer 17, and a $TiO_2$ layer 13 which are disposed in the lower part of the multilayer film are formed in that order by a MOCVD (Metal Organic Chemical Vapor Deposition) method, for example. Moreover, a $SiO_2$ portion 11b that constitutes the defect layer 11 is laminated on the entire top surface of the $TiO_2$ layer 13. At that time, it is preferable to laminate a low refractive-index material for the purpose of manufacturing.

Figure 9B:
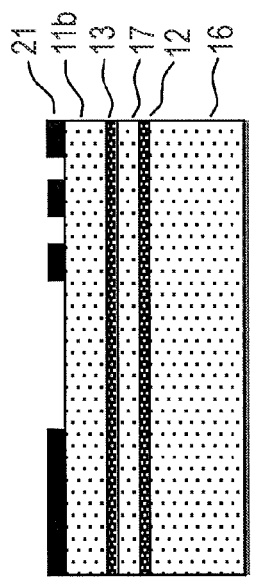

After that, as shown in FIG. 9B, a mask pattern for forming a microstructure of the defect layer 11 is placed on the $SiO_2$ portion 11b, and a microstructure pattern is transferred to a resist 21 by photolithography or an electron beam drawing method.

Figure 9C:
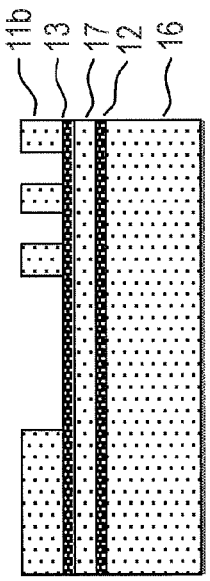

Then, as shown in FIG. 9C, the transferred microstructure pattern is transferred to the $SiO_2$ portion 11b by performing a dry etching such as RIE (Reactive Ion Etching), for example.

Figure 9D:
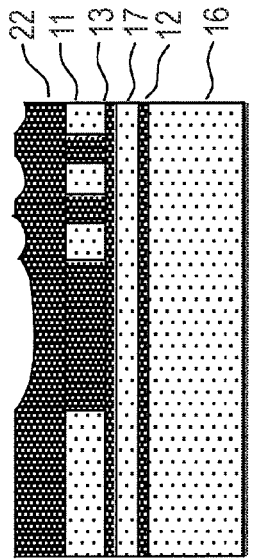

Subsequently, as shown in FIG. 9D, $TiO_2$ which is another material that constitutes the defect layer 11 is deposited using a MOCVD method, for example, so as to cover the $SiO_2$ portion 11b in which the microstructure pattern is transferred, thus burying a groove shape in the $SiO_2$ portion 11b. At that time, it is preferable to laminate a high refractive-index material for the purpose of manufacturing.

Figure 9E:
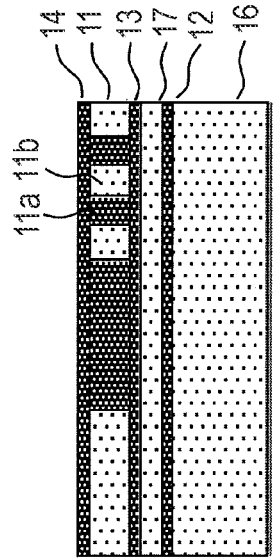

After that, as shown in FIG. 9E, a planarization process based on a CMP (Chemical Mechanical Polishing), for example, is performed on a top surface side of the deposited $TiO_2$ layer 22. This is because the concave-convex shape based on the microstructure pattern is also transferred to the top surface side of the $TiO_2$ layer 22. By this planarization process, the defect layer 11 in which the pattern of the $TiO_2$ portions 11a and the $SiO_2$ portions 11b is arranged and the $TiO_2$ layer 14 covering the top surface side of the defect layer 11 are formed.

Figure 9F:
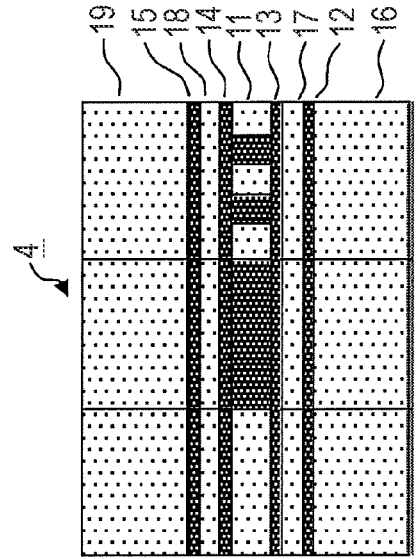

After the planarization process is completed, as shown in FIG. 9F, a $SiO_2$ layer 18, a $TiO_2$ layer 15, and a $SiO_2$ layer 19 which are disposed on the upper part of the multilayer film are formed in that order on the $TiO_2$ layer 14 by a MOCVD method, for example.

By the above-mentioned processes, an OCCF 4 having a configuration shown in FIG. 3 is manufactured.

As described above, in the OCCF 4 of the solid-state imaging device according to the present embodiment, a plurality of kinds of materials having different refractive indices are arranged so as to coexist in a surface parallel to the light-receiving surface of the light-receiving element 1, thus forming the defect layer 11. For this reason, the refractive index of the defect layer 11 depends on the ratio of areas of the respective materials that coexist in a regular pattern. That is to say, by changing the area ratio (duty ratio) of the respective materials in the surface, a desired wavelength of light is allowed to pass therethrough. Therefore, even when different optical characteristics are obtained for each pixel, it is not necessary to change the thickness of the defect layer 11 from pixel to pixel.

More specifically, the OCCF 4 of the solid-state imaging device according to the present embodiment has a configuration such that the ratio of areas of the $TiO_2$ portions 11a and the $SiO_2$ portions 11b which are arranged in a regular pattern in the defect layer 11 is set based on the wavelength of light reaching the light-receiving element 1. That is to say, when the plurality of light-receiving elements 1 are arranged so as to correspond to different colors, respectively, and different optical characteristics are obtained for each pixel, it is only necessary to change the duty ratio of the $TiO_2$ portions 11a and the $SiO_2$ portions 11b in the defect layer 11 for each pixel. Therefore, even when different optical characteristics are obtained for each pixel, it is not necessary to change the thickness of the defect layer 11 from pixel to pixel. That is to say, even when the colors of adjacent pixel regions in the Bayer arrangement are different, it is not necessary to change the thickness (height) of the defect layer 11 for each pixel.

As seen above, according to the present embodiment, even when a multilayer film in which inorganic material layers are laminated is used as the OCCF 4 for achieving color separation, the multilayer film has a uniform thickness and will not have a stepped shape in each pixel. That is to say, it is possible to eliminate a non-effective region resulting from steps which appear in each pixel in the related art, and to form a reliable surface so as to have a uniform thickness. Therefore, it is possible to prevent the amount of transmitted light from decreasing due to a bulge of the step portions.

In addition, in the OCCF 4 according to the present embodiment, the $TiO_2$ portions 11a and the $SiO_2$ portions 11b which constitute the defect layer 11 coexist in the surface parallel to the light-receiving surface of the light-receiving element 1 symmetrically in two orthogonal directions. That is to say, the arrangement pattern of the $TiO_2$ portions 11a and the $SiO_2$ portions 11b is symmetrical in two orthogonal directions in the surface. Therefore, by arranging the respective materials constituting the defect layer 11 in a regular pattern, it is possible to eliminate the effect of polarization components included in an incident light. That is to say, by eliminating polarization dependence, it is possible to prevent the transmittance from being different due to polarization components.

From these advantages, according to the present embodiment, it is possible to obtain good optical characteristics for the multilayer film used as the OCCF 4. That is to say, even when color separation is achieved using an inorganic multilayer film, the inorganic multilayer film does not have a stepped shape but has a uniform thickness for each pixel, whereby good optical characteristics can be obtained.

In the OCCF 4 described in the present embodiment, $SiO_2$ and $TiO_2$ are used as the plurality of inorganic materials constituting the multilayer film. Moreover, $SiO_2$ and $TiO_2$ are used as the plurality of kinds of materials constituting the defect layer 11 in the multilayer film. That is to say, the respective materials are composed of two materials which have a refractive index difference of 1 or more. The reason for using such materials is based on the following facts.

Figure 10:
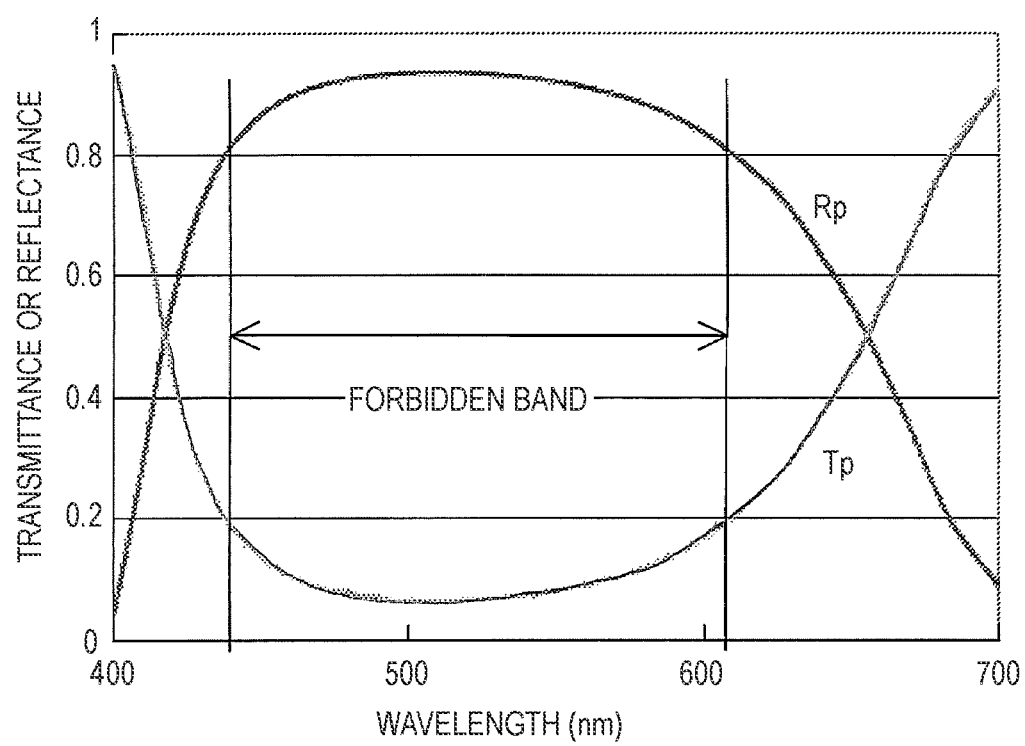
FIG. 10 is a graph showing a specific example of reflection/transmission characteristics when there is no defect layer in which a relation (refractive index difference $\Delta n$)=(high refractive index nh)−(low refractive index nl)=1 is satisfied (i.e., the thickness of the defect layer is $\lambda/4$).

FIG. 10 is a graph showing a specific example of reflection/transmission characteristics when there is no defect layer in which a relation (refractive index difference $\Delta n$)=(high refractive index nh)−(low refractive index nl)=1 is satisfied (i.e., the thickness of the defect layer is $\lambda/4$).

The OCCF 4 of a solid-state imaging device is necessary to provide reflection characteristics of 80% or more with respect to blue light (wavelength: 450 nm) and red light (wavelength: 600 nm), for example, so that light incident to a certain color filter does not transmit through other color filters of other colors. For this reason, a refractive index difference ($\Delta n$=nh−nl) of 1 or more is necessary.

Therefore, the plurality of inorganic materials that constitute the multilayer film and the plurality of kinds of materials having different refractive indices that constitute the defect layer 11 are preferably composed of two materials which have a refractive index difference of 1 or more.

Although in the present embodiment, $TiO_2$ (refractive index nh=2.5) and $SiO_2$ (refractive index nl=1.5) are exemplified as the two materials having a refractive index difference of 1 or more, the materials that can be used are not limited to these materials.

Moreover, in the OCCF 4 described in the present embodiment, the laminated structure constituting the multilayer film has such a structure that two layers made of a plurality of inorganic materials are laminated above and below the defect layer 11. That is to say, the laminated structure of the multilayer film includes 9 layers in total that are composed of a laminated structure in which the respective layers 12 to 19 are repeatedly and sequentially arranged above and below the defect layer 11. Therefore, even when a multilayer film made of inorganic materials is used as the OCCF 4 of a solid-state imaging device, it is possible to provide optical characteristics necessary for the OCCF 4.

3. Second Embodiment

Next, another exemplary configuration of a main part of the solid-state imaging device according to an embodiment of the present invention will be described.

In this section, only the difference from the first embodiment will be described.

Figure 11:
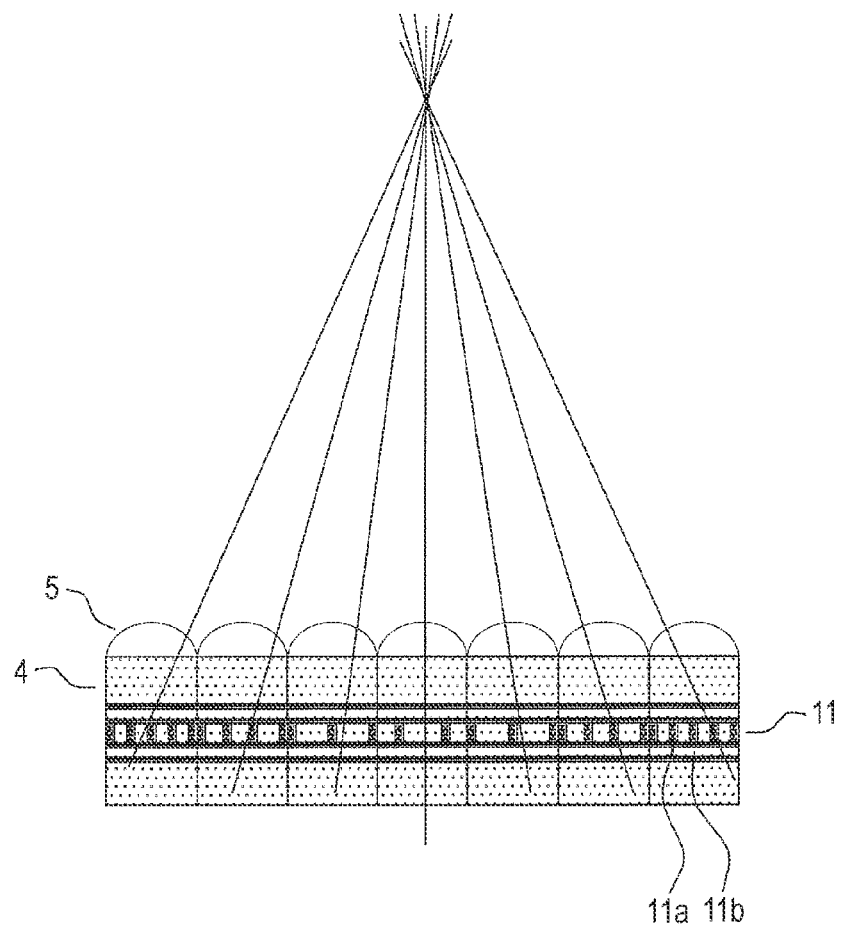
FIG. 11 is a sectional side view showing another exemplary specific configuration of the OCCF according to the embodiment of the present invention.

FIG. 11 is a sectional side view showing another exemplary specific configuration of the OCCF according to the embodiment of the present invention.

The OCCF 4 shown in FIG. 11 has the defect layer 11 which is different from that of the first embodiment described above.

In the defect layer 11 according to the present embodiment, the ratio of areas of the respective portions 11a and 11b in the regular pattern of the TiO$_2$ portions 11a and the SiO$_2$ portions 11b constituting the defect layer 11 is different at respective positions which correspond to the plurality of light-receiving elements 1 arranged in the surface. That is to say, the area ratio (duty ratio) of the TiO$_2$ portions 11a and the SiO$_2$ portions 11b is different for each pixel region.

More specifically, the duty ratio of the TiO$_2$ portions 11a and the SiO$_2$ portions 11b is different at different positions which are respectively located closer to a central portion and a periphery of an effective imaging region that is formed by each of the plurality of light-receiving elements 1.

This is because in a solid-state imaging device, the incidence angle of light tends to incline as the light is incident to positions closer to the periphery of an effective imaging region. That is to say, in order to cope with the inclination of the incidence angle at the periphery of the effective imaging region, it is necessary to change the optical characteristics (specifically, transmittance or a refractive index) in the defect layer 11 so as to be different at positions which are located closer to the central portion and the periphery of the effective imaging region even when the effective imaging region corresponds to the same color, for example.

Therefore, in the arrangement pattern of the TiO$_2$ portions 11a and the SiO$_2$ portions 11b in the defect layer 11, the area ratio of the TiO$_2$ portions 11a and the SiO$_2$ portions 11b is changed so that a higher refractive index is obtained at the periphery of the effective imaging region than at the central portion, for example.

Figure 12:
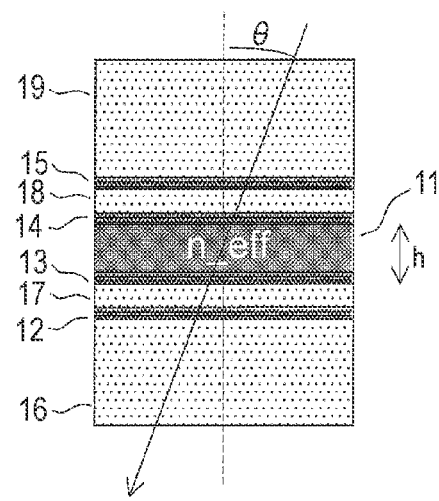
FIG. 12 is a diagram showing a specific example of the relationship between a laminated structure that forms a multilayer film and an incidence angle.

FIG. 12 is a diagram showing a specific example of the relationship between a laminated structure that forms a multilayer film and an incidence angle.

The refractive index n_eff and the thickness h of the defect layer 11 relative to light at an incidence angle θ can be expressed by Formulas 5 and 6 below.

$$n\_eff \cdot h \cdot \cos\theta = \lambda/2 \qquad (5)$$

$$\cos\theta = \lambda/[2 \cdot h \cdot \{nl \cdot d + nh \cdot (1-d)\}] \qquad (6)$$

The incidence angle θ of light is determined by optical components such as lenses that are used together with a solid-state imaging device. Therefore, when the incidence angle θ of light is determined, the refractive index n_eff or the thickness h of the defect layer 11 can be determined by Formula 5 or 6.

However, according to a technique that changes the thickness h of the defect layer 11 based on the incidence angle θ, it is very difficult to determine the thickness reliably. Moreover, steps may be formed in the multilayer film due to a change in thickness h.

For this reason, in the present embodiment, the refractive index n_eff of the defect layer 11, namely the area ratio of the TiO$_2$ portions 11a and the SiO$_2$ portions 11b is changed based on the incidence angle θ of light while maintaining the thickness h to be uniform.

As described above, in the OCCF 4 of the solid-state imaging device according to the present embodiment, the ratio of areas of the TiO$_2$ portions 11a and the SiO$_2$ portions 11b in the defect layer 11 is different at different positions which are respectively located closer to the central portion and the periphery of the effective imaging region that is formed by the light-receiving element 1. Therefore, it is possible to prevent a decrease in transmittance at the periphery while coping with the inclination of the incidence angle at the periphery of the effective imaging region. That is to say, it is possible to efficiently cope with the inclination of the incidence angle of light at the periphery of the effective imaging region in the solid-state imaging device.

4. Third Embodiment

Next, another exemplary configuration of a main part of the solid-state imaging device according to an embodiment of the present invention will be described.

In this section, only the difference from the first or second embodiment will be described.

Figure 13:
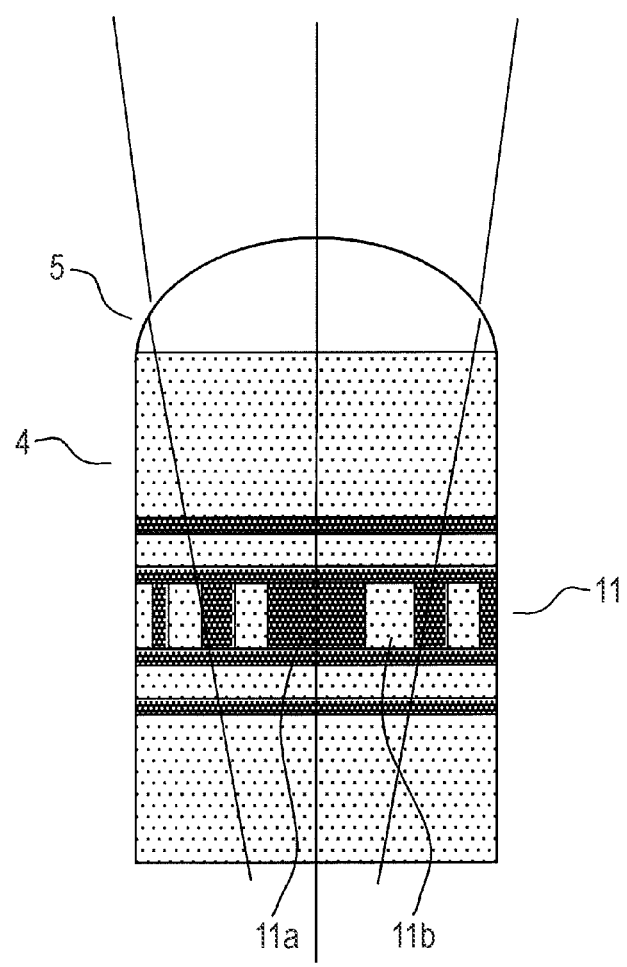
FIG. 13 is a sectional side view showing another exemplary specific configuration of the OCCF according to the embodiment of the present invention.

FIG. 13 is a sectional side view showing another exemplary specific configuration of the OCCF according to the embodiment of the present invention.

The OCCF 4 shown in FIG. 13 has the defect layer 11 which is different from that of the first or second embodiment.

In the defect layer 11 according to the present embodiment, the ratio of areas of the TiO$_2$ portions 11a and the SiO$_2$ portions 11b constituting the defect layer 11 is different at different positions which are respectively located closer to the central portion and the periphery of a region corresponding to one light-receiving element 1. That is to say, the area ratio (duty ratio) of the TiO$_2$ portions 11a and the SiO$_2$ portions 11b which are arranged in a regular pattern is different at different positions which are respectively located closer to the central portion and the periphery of one pixel region formed by each of the light-receiving elements 1. Here, the area ratio refers to the ratio of the area of the TiO$_2$ portions 11a and the area of the SiO$_2$ portions 11b that coexist in each sub-divided region when one pixel region is divided into a plurality of the sub-divided regions.

This is because light being transmitted through the defect layer 11 has also been transmitted through the OCL 5, even in one pixel region, the incidence angle of light tends to incline as the light becomes incident to positions closer to the periphery of the pixel region. That is to say, in order to cope with the inclination of the incidence angle at the periphery of the pixel region, it is necessary to change the optical characteristics (specifically, transmittance or a refractive index) in the defect layer 11 so as to be different at positions which are located closer to the central portion and the periphery of the pixel region even in the same pixel region, for example.

Therefore, in the TiO$_2$ portions 11a and the SiO$_2$ portions 11b in one pixel region, the duty ratio of the TiO$_2$ portions 11a and the SiO$_2$ portions 11b is changed so that a higher refractive index is obtained at the periphery of the pixel region than at the central portion, for example.

The relationship between the incidence angle θ of light and the refractive index n_eff of the defect layer 11 is the same as that in the second embodiment described above.

Moreover, the relationship with other pixel regions is maintained uniformly similar to that described in the first embodiment. That is to say, the distribution density of the TiO$_2$ portions 11a and the SiO$_2$ portions 11b is uniformly changed in each pixel region. However, as described in the second embodiment, the distribution density may be changed for each pixel region. That is to say, the duty ratio of the TiO$_2$ portions 11a and the SiO$_2$ portions 11b may be changed for each pixel region, while changing the duty ratio of the TiO$_2$ portions 11a and the SiO$_2$ portions 11b in each of the pixel regions.

As described above, in the OCCF 4 of the solid-state imaging device according to the present embodiment, the distribution density of the TiO$_2$ portions 11a and the SiO$_2$ portions 11b in the defect layer 11 is different at different positions which are respectively located closer to the central portion and the periphery of one pixel region. Therefore, it is possible to prevent a decrease in transmittance at the periphery even when the incidence angle of light is inclined at the periphery of one pixel region after the light passes through the OCL 5. That is to say, it is possible to efficiently cope with the inclination of the incidence angle of light at the periphery of one pixel region.

5. Exemplary Configuration of Electronic Apparatus

The present invention is not limited to application in a solid-state imaging device but can be applied to an electronic apparatus such as an imaging apparatus. Here, the electronic apparatus may be an imaging apparatus (camera system) such as a digital camera or a video camera, or a mobile apparatus such as a cellular phone or a PDA (Personal Digital Assistant) having an imaging function. Moreover, the imaging apparatus may be configured in a form of modules that are mounted on the electronic apparatus, namely a camera module.

Imaging Apparatus

Figure 14:
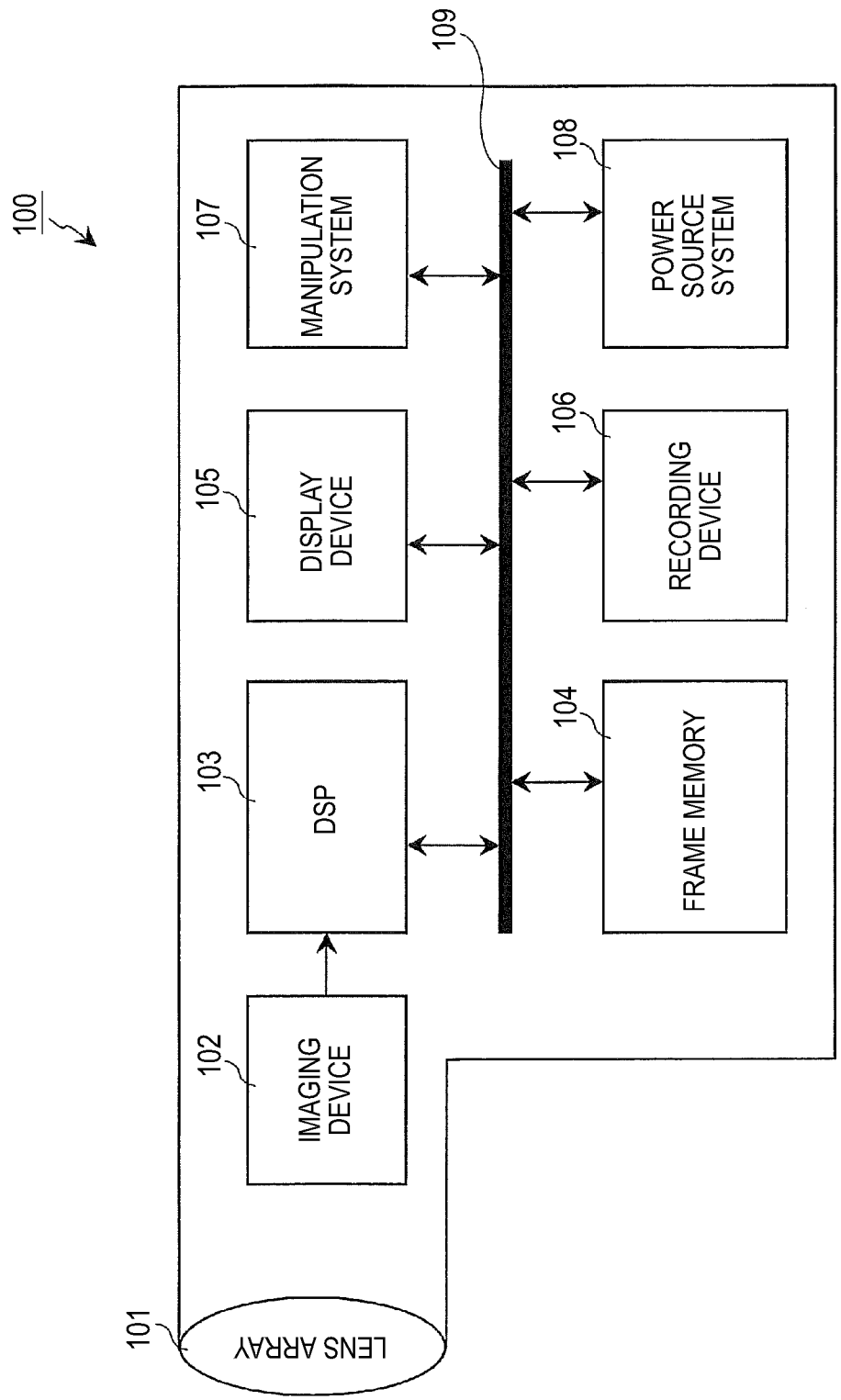
FIG. 14 is a block diagram showing an exemplary configuration of an imaging apparatus which is an example of an electronic apparatus according to the embodiment of the present invention.

FIG. 14 is a block diagram showing an exemplary configuration of an imaging apparatus which is an example of an electronic apparatus according to the embodiment of the present invention.

As shown in FIG. 14, an imaging apparatus 100 according to the embodiment of the present invention includes an optical system including a lens array 101 and the like, an imaging device 102, a DSP circuit 103 which is a camera signal processing unit, a frame memory 104, a display device 105, a recording device 106, a manipulation system 107, a power source system 108, and the like. Moreover, the DSP circuit 103, the frame memory 104, the display device 105, the recording device 106, the manipulation system 107, and the power source system 108 are connected to each other via a bus line 109.

The lens array 101 captures an incident light (image light) from a subject to be focused on an imaging surface of the imaging device 102.

The imaging device 102 converts the amount of incident light focused on the imaging surface by the lens array 101 to electrical signals for each pixel and outputs the electrical signals as pixel signals. As the imaging device 102, the solid-state imaging device according to the embodiments described above is used.

The display device 105 is configured by a panel display device such as a liquid-crystal display device or an organic EL (Electro Luminescence) display device and displays moving pictures or still images that are imaged by the imaging device 102.

The recording device 106 records the moving pictures or the still images imaged by the imaging device 102 on a recording medium such as a video tape or a DVD (Digital Versatile Disk).

The manipulation system 107 issues manipulation instructions related to various functions of the imaging apparatus under the control of a user.

The power source system 108 appropriately supplies various power sources which function as operation power sources for the DSP circuit 103, the frame memory 104, the display device 105, the recording device 106, and the manipulation system 107 to these supply targets.

Such an imaging apparatus 100 is applied to a video camera or a digital camera, and a camera module for mobile apparatuses such as cellular phones. Since the solid-state imaging device according to the embodiments described above is used as the imaging device 102 of the imaging apparatus 100, the solid-state imaging device is able to obtain good optical characteristics, and thus an electronic apparatus having excellent image quality can be provided. Moreover, since it is possible to easily cope with miniaturization of a pixel size, high-resolution images resulting from an increased number of pixels can be obtained.

Although specific preferred embodiments of the present invention have been described and illustrated in the embodiments described above, the present invention is not limited to above contents.

For example, the formation materials, dimensions, and the like of the constituent elements of the solid-state imaging device described and illustrated in the respective embodiments are only illustrations of examples of concretization at the time of carrying out the present invention. That is, it should be understood that the technical scope of the present invention is not limited to these examples.

Therefore, the present invention is not limited to the contents described in the respective embodiments but can be appropriately modified without departing from the spirit of the present invention.

What is claimed is:

1. A solid-state imaging device comprising:
a light-receiving element; and
a multilayer film having a laminated structure disposed on a side of a light-receiving surface of the light-receiving element, the laminated structure including a defect layer laminated between a plurality of layers, wherein the plurality of layers are made of materials having different refractive indices and each layer of the plurality of layers is based on a wavelength of light,
wherein the defect layer includes:
a plurality of kinds of materials having different refractive indices that coexist in a surface parallel to the light-receiving surface, wherein a ratio of the materials transmits a specific color component of light, and different ratios of materials at different positions which are respectively located closer to a central portion and a periphery of an effective imaging region that is formed by each of the light-receiving elements such that a higher refractive index is obtained at the periphery of the effective imaging region than at the central portion.

2. The solid-state imaging device according to claim 1, wherein the plurality of materials that constitute the multilayer film are inorganic materials.

3. The solid-state imaging device according to claim 1, wherein: further comprising a plurality of the light-receiving elements, wherein the ratio of the materials in the defect layer is different at respective positions corresponding to the respective light-receiving elements.

4. The solid-state imaging device according to claim 1, wherein two layers made of different materials are laminated above the defect layer and two layers made of different materials are laminated below the defect layer.

5. A solid-state imaging device comprising:
a light-receiving element; and
a multilayer film having a laminated structure disposed on a side of a light-receiving surface of the light-receiving element, the laminated structure including a defect layer laminated between a plurality of layers, wherein the plurality of layers are made of materials having different refractive indices and each layer of the plurality of layers is based on a wavelength of light,
wherein a portion of in the defect layer includes:
a plurality of kinds of materials having different refractive indices that coexist in a surface parallel to the light-receiving surface, wherein a ratio of the materials transmits a specific color component of light, and different ratios of materials at different positions which are respectively located closer to a central portion and a periphery of one pixel region that is formed by each of the light-receiving elements such that a higher refractive index is obtained at the periphery of an effective imaging region formed by the light-receiving element than at the central portion.

6. The solid-state imaging device according to claim 5, wherein the plurality of materials that constitute the multilayer film are inorganic materials.

7. The solid-state imaging device according to claim 5, further comprising a plurality of the light-receiving elements, wherein the ratio of the materials in the defect layer is different at respective positions which correspond to the respective light-receiving elements.

8. The solid-state imaging device according to claim 5, wherein the plurality of materials that constitute the multilayer film and the plurality of kinds of materials having different refractive indices that constitute the defect layer are composed of two materials which have a refractive index difference of 1 or more.

9. The solid-state imaging device of claim 1, wherein the ratio of the materials that coexist in the defect layer is based on a wavelength of light reaching the light-receiving element.

10. The solid-state imaging device of claim 5, wherein the ratio of the materials that coexist in the defect layer is based on a wavelength of light reaching the light-receiving element.

11. A solid-state imaging device comprising:
a first light-receiving element;
a second light-receiving element; and
a multilayer film having a laminated structure disposed on a side of a light-receiving surface of each of the first and second the light-receiving elements, the laminated structure including a defect layer laminated between a plurality of layers, wherein the plurality of layers are made of materials having different refractive indices and each layer of the plurality of layers is based on a wavelength of light, wherein the defect layer includes:
a plurality of kinds of materials having different refractive indices that coexist in a surface parallel to the light-receiving surface,
a first ratio of materials in a first portion that transmits a first color component of light and a second ratio of materials in a second portion that transmits a second color component of light, and
a different ratio of materials at different positions which are respectively located closer to a central portion and a periphery of an effective imaging region formed by each of the first and second light-receiving elements such that a higher refractive index is obtained at the periphery of the effective imaging region than at the central portion.

12. The solid-state imaging device according to claim 11, wherein the plurality of materials that constitute the multilayer film are inorganic materials.

13. The solid-state imaging device according to claim 1, wherein two layers made of different materials are laminated above the defect layer and two layers made of different materials are laminated below the defect layer.

* * * * *